(12) United States Patent
Harame et al.

(10) Patent No.: US 9,159,816 B2
(45) Date of Patent: Oct. 13, 2015

(54) PNP BIPOLAR JUNCTION TRANSISTOR FABRICATION USING SELECTIVE EPITAXY

(71) Applicant: International Business Machines Corporation, Armonk, NY (US)

(72) Inventors: David L. Harame, Essex Junction, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/497,579

(22) Filed: Sep. 26, 2014

(65) Prior Publication Data

US 2015/0008562 A1 Jan. 8, 2015

Related U.S. Application Data

(62) Division of application No. 13/294,697, filed on Nov. 11, 2011, now Pat. No. 8,921,194.

(51) Int. Cl.

| | |
|---|---|
| H01L 29/735 | (2006.01) |
| H01L 21/8228 | (2006.01) |
| H01L 29/66 | (2006.01) |
| H01L 21/8224 | (2006.01) |
| H01L 27/082 | (2006.01) |
| H01L 29/737 | (2006.01) |
| H01L 29/10 | (2006.01) |
| H01L 29/06 | (2006.01) |
| H01L 29/08 | (2006.01) |
| H01L 29/16 | (2006.01) |

(52) U.S. Cl.
CPC .......... *H01L 29/735* (2013.01); *H01L 21/8224* (2013.01); *H01L 21/8228* (2013.01); *H01L 27/0821* (2013.01); *H01L 29/0649* (2013.01); *H01L 29/0808* (2013.01); *H01L 29/0826* (2013.01); *H01L 29/1004* (2013.01); *H01L 29/1008* (2013.01); *H01L 29/16* (2013.01); *H01L 29/6625* (2013.01); *H01L 29/66272* (2013.01); *H01L 29/7371* (2013.01)

(58) Field of Classification Search
None
See application file for complete search history.

(56) References Cited

U.S. PATENT DOCUMENTS

| | | | |
|---|---|---|---|
| 5,045,912 | A | 9/1991 | Ohki |
| 5,298,786 | A | 3/1994 | Shahidi et al. |
| 5,508,553 | A | 4/1996 | Nakamura et al. |
| 5,581,112 | A * | 12/1996 | Li et al. .......................... 257/557 |
| 5,583,059 | A | 12/1996 | Burghartz |

(Continued)

OTHER PUBLICATIONS

Daniel M. Luke, Examiner, USPTO, Notice of Allowance issued in U.S. Appl. No. 13/294,967 dated Aug. 25, 2014.

(Continued)

*Primary Examiner* — Daniel Luke
(74) *Attorney, Agent, or Firm* — Thompson Hine LLP; Anthony J. Canale

(57) ABSTRACT

Lateral PNP bipolar junction transistors and design structures for a lateral PNP bipolar junction transistor. An emitter and a collector of the lateral PNP bipolar junction transistor are comprised of p-type semiconductor material that is formed by a selective epitaxial growth process. The source and drain each directly contact a top surface of a device region used to form the emitter and collector. A base contact may be formed on the top surface and overlies an n-type base defined within the device region. The emitter is laterally separated from the collector by the base contact. Another base contact may be formed in the device region that is separated from the other base contact by the base.

15 Claims, 10 Drawing Sheets

(56) References Cited

U.S. PATENT DOCUMENTS

| | | |
|---|---|---|
| 6,249,031 B1 | 6/2001 | Verma et al. |
| 6,329,698 B1 | 12/2001 | Koscielniak et al. |
| 6,501,152 B1 | 12/2002 | Johnson |
| 6,617,220 B2 | 9/2003 | Dunn et al. |
| 6,876,060 B2 | 4/2005 | Ikeda |
| 7,217,609 B2 | 5/2007 | Norstrom et al. |
| 7,723,803 B2 | 5/2010 | Chung |
| 7,898,008 B2 | 3/2011 | Fallica et al. |
| 8,288,758 B2 | 10/2012 | Ning et al. |
| 2005/0037587 A1 | 2/2005 | Martinet et al. |
| 2009/0045467 A1 | 2/2009 | Kakoschke et al. |
| 2012/0139009 A1 | 6/2012 | Ning et al. |

OTHER PUBLICATIONS

Daniel M. Luke, Examiner, USPTO, Office Action issued in U.S. Appl. No. 13/294,697 dated Jul. 22, 2014.

T. C. Chen et al., "Lateral Bipolar Transistor with Elevated Base Contact", IBM Tech. Discl. Bull., Nov. 1989, pp. 157-159.

Daniel M. Luke, Examiner, USPTO, Office Action issued in U.S. Appl. No. 13/294,697 dated Feb. 21, 2014.

\* cited by examiner

PNP BIPOLAR JUNCTION TRANSISTOR FABRICATION USING SELECTIVE EPITAXY

BACKGROUND

The present invention relates to semiconductor device fabrication and, more specifically, to bipolar junction transistors, fabrication methods for bipolar junction transistors, and design structures for a bipolar junction transistor.

Bipolar junction transistors are typically found in demanding types of integrated circuits, especially integrated circuits for high-frequency applications. One application for bipolar junction transistors is in radiofrequency integrated circuits (RFICs), which are used in wireless communications systems, power amplifiers in cellular telephones, and other types of high speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors are three-terminal electronic devices that include three semiconductor regions, namely an emitter, a base, and a collector. Generally, a bipolar junction transistor includes a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base.

Improved devices, fabrication methods, and design structures are needed for bipolar junction transistors that extend the capabilities of the technology.

SUMMARY

According to one embodiment of the present invention, a method is provided for fabricating a lateral PNP bipolar junction transistor. The method includes forming a first base contact at a location on a top surface of a first device region that is aligned with a base of n-type semiconductor material within the first device region. The method further includes forming an emitter and a collector comprised of p-type semiconductor material and directly contacting the top surface of the device region. When formed, the first base contact and the base are laterally between the emitter and the collector.

According to another embodiment of the present invention, a device structure for a lateral PNP bipolar junction transistor includes a base comprised of n-type semiconductor material, and a base contact positioned at a location on the top surface of the device region that is in vertical alignment with the base. The device structure further includes an emitter and a collector that are comprised of p-type semiconductor material and in direct contact with the top surface of the device region. The base contact and the base are laterally positioned between the emitter and the collector.

According to another embodiment of the present invention, a hardware description language (HDL) design structure is encoded on a machine-readable data storage medium. The HDL design structure comprises elements that, when processed in a computer-aided design system, generates a machine-executable representation of a lateral PNP bipolar junction transistor. The HDL design structure includes a base comprised of n-type semiconductor material, and a base contact positioned at a location on the top surface of the device region that is in vertical alignment with the base. The design structure further includes an emitter and a collector that are comprised of p-type semiconductor material and in direct contact with the top surface of the device region. The base contact and the base are laterally positioned between the emitter and the collector. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 2A-8A and 2B-8B are cross-sectional views of the respective substrate portions shown in FIGS. 1A, 1B at successive subsequent fabrication stages of the processing method.

DETAILED DESCRIPTION

Figure 1A:
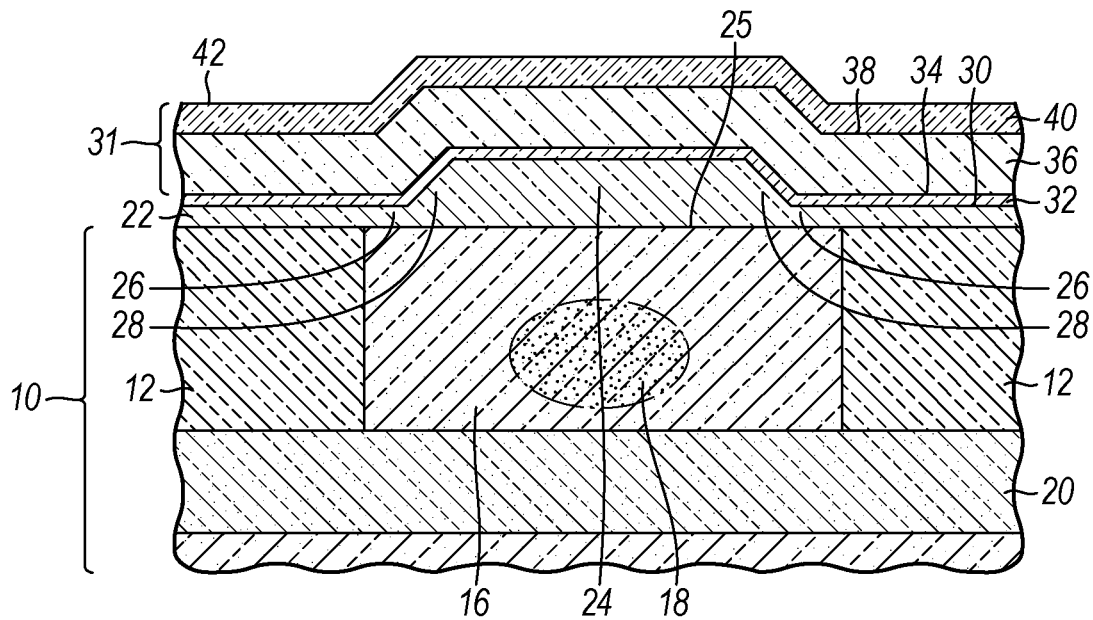
FIG. 1A is a cross-sectional view of a portion of a substrate at an initial stage of a processing method for fabricating an NPN bipolar junction transistor in accordance with an embodiment of the invention.
Figure 1B:
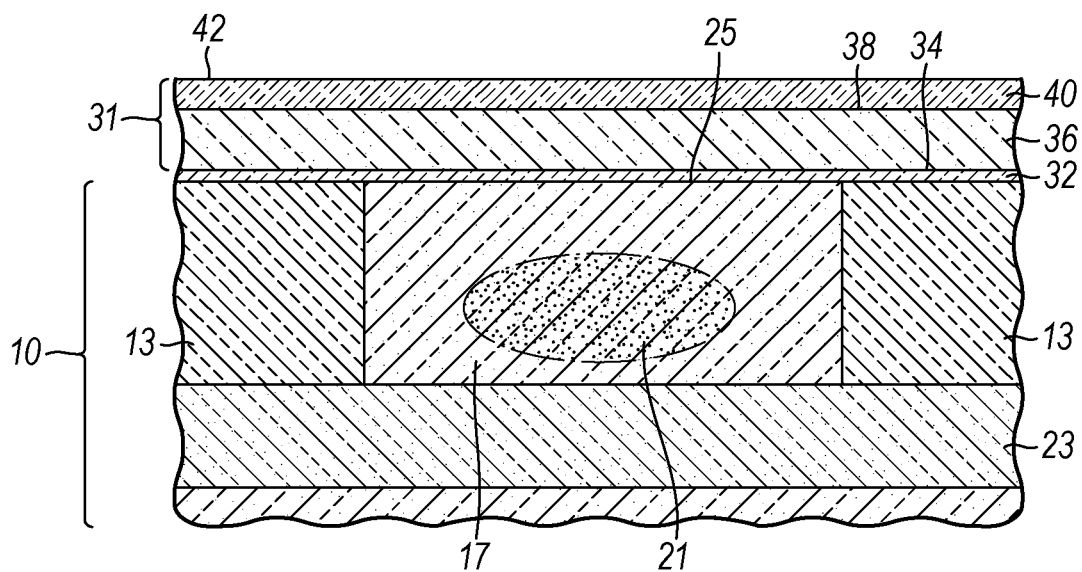
FIG. 1B is a cross-sectional view similar to FIG. 1A of a different portion of the substrate at an initial stage of a processing method for fabricating a PNP bipolar junction transistor in accordance with an embodiment of the invention.
Figure 8A:
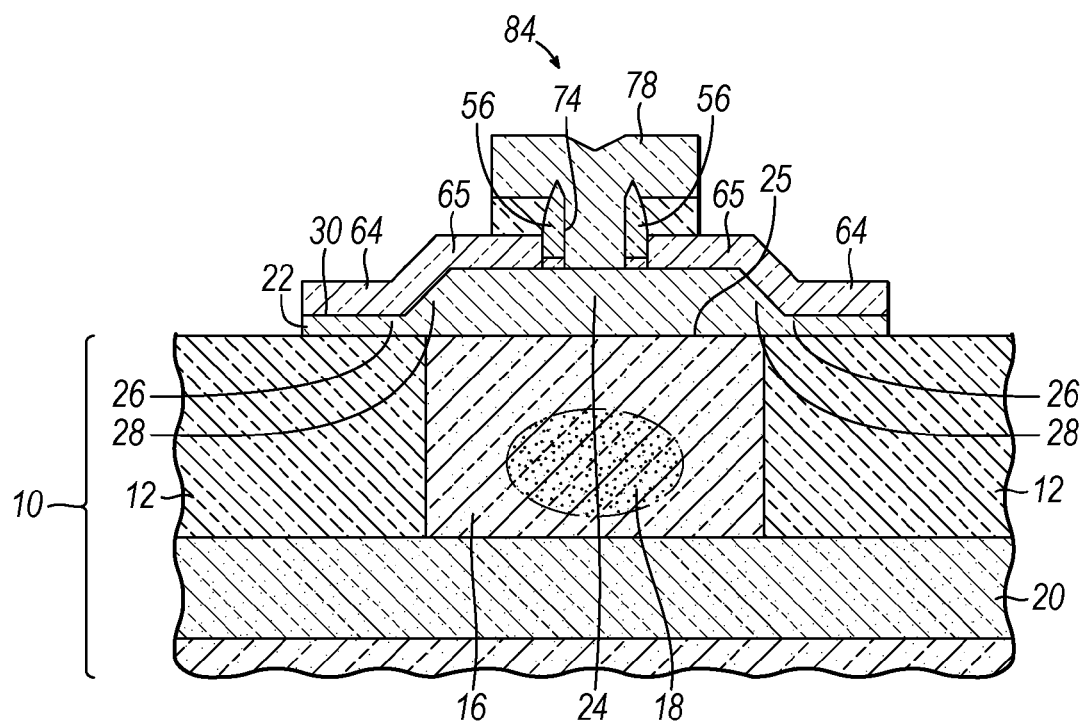
Figure 8B:
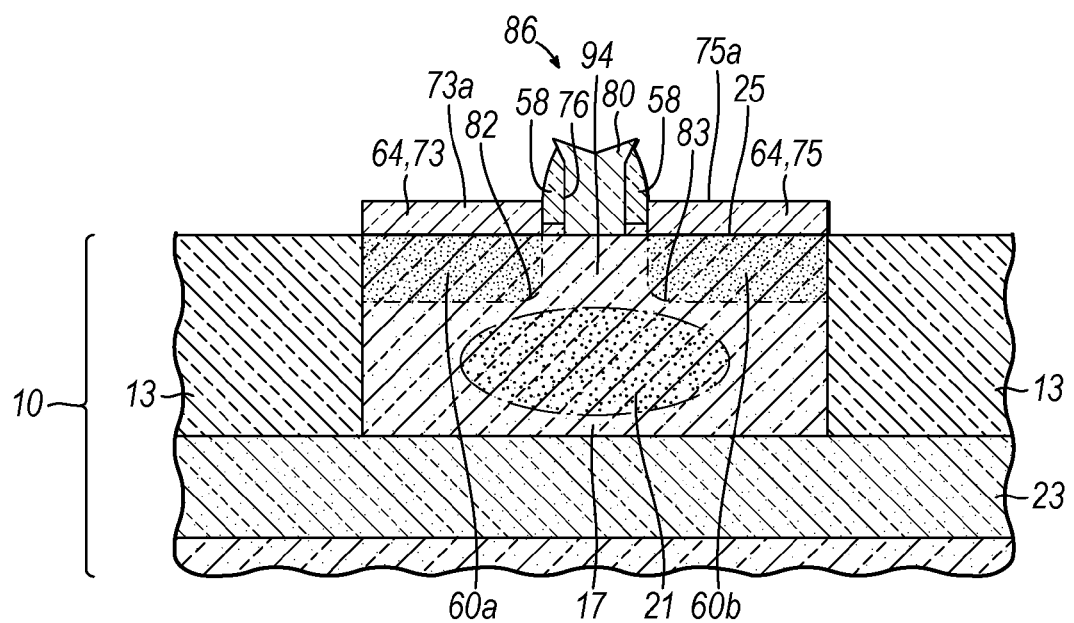
Figure 9:
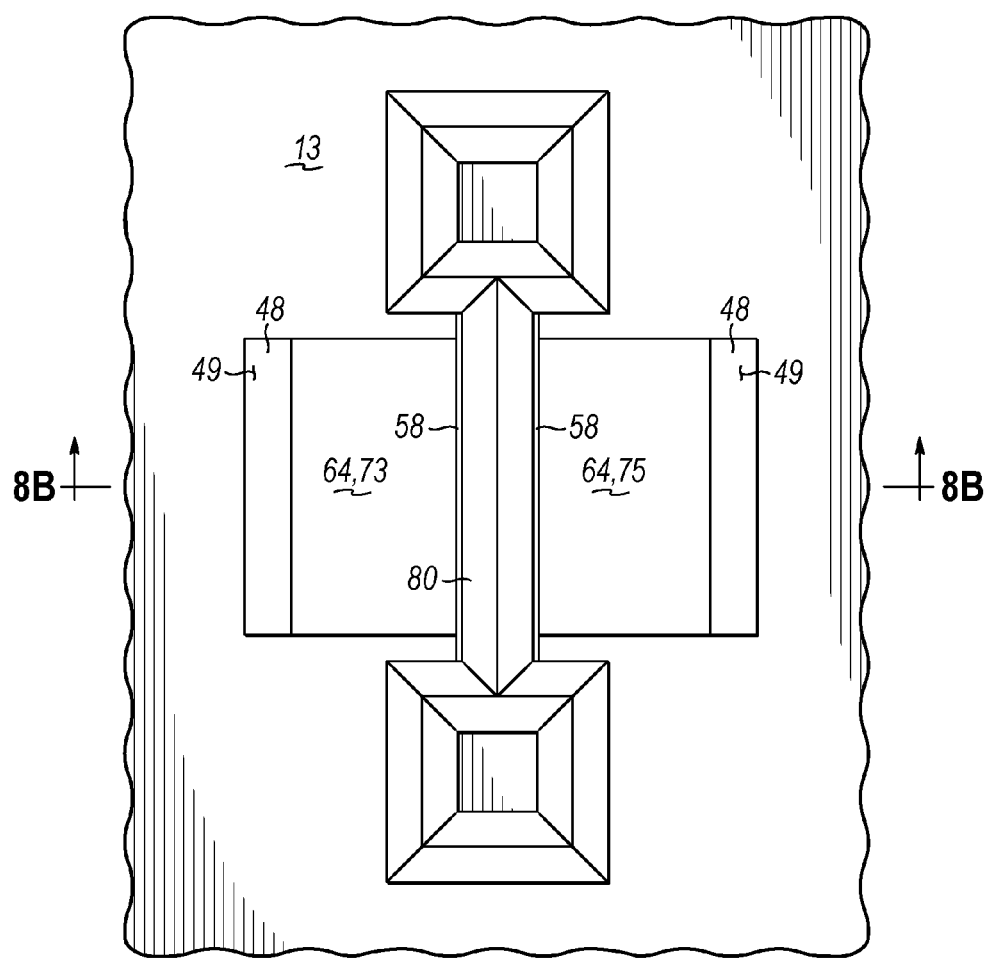
FIG. 9 is a top view of the PNP bipolar junction transistor of FIG. 8B

With reference to FIGS. 1A, 1B and in accordance with an embodiment of the invention, a substrate 10 includes trench isolation regions 12, 13 that circumscribe and electrically isolate device regions 16, 17. Device region 16 is used in the fabrication of a NPN bipolar junction transistor 84 (FIG. 8A). Device region 17 is used in the fabrication of a PNP bipolar junction transistor 86 (FIGS. 8B, 9).

The substrate 10 may be any type of suitable bulk substrate comprising a semiconductor material suitable for forming an integrated circuit. For example, the substrate 10 may be a wafer comprised of a monocrystalline silicon-containing material, such as single crystal silicon wafer with a (100) crystal lattice orientation. The monocrystalline semiconductor material of the substrate 10 may contain a definite defect concentration and still be considered single crystal. The semiconductor material comprising substrate 10 may include an optional epitaxial layer on a bulk substrate, such as an epitaxial layer comprised of lightly-doped n-type semiconductor material that defines a top surface 25 and that covers an oppositely-doped bulk substrate.

Trench isolation regions 12, 13 may be isolation structures formed by a shallow trench isolation (STI) technique that relies on a lithography and dry etching process to define closed-bottomed trenches in substrate 10, fill the trenches with dielectric, and planarize the layer relative to the top surface 25 of the substrate 10 using a chemical mechanical polishing (CMP) process. The dielectric may be comprised of an oxide of silicon, such as densified tetraethylorthosilicate (TEOS) deposited by chemical vapor deposition (CVD) or a high-density plasma (HDP) oxide deposited with plasma assistance.

A collector 18 and a subcollector 20 of the NPN bipolar junction transistor 84 and a base contact 21 and a subbase region 23 of the PNP bipolar junction transistor 86 are present as impurity-doped regions in the respective device regions 16, 17. The collector 18, subcollector 20, base contact 21, and subbase region 23 may be formed beneath the top surface 25 by introducing an electrically-active dopant, such as an impurity species from Group V of the Periodic Table (e.g., phosphorus (P), arsenic (As), or antimony (Sb)) effective to impart an n-type conductivity in which electrons are the majority carriers and dominate the electrical conductivity of the host semiconductor material. In one embodiment, the collector 18, the subcollector 20, base contact 21, and the subbase region 23 may be formed by ion implanting an n-type impurity species and thereafter annealing to activate the impurity species and lessen implantation damage using techniques and conditions familiar to one skilled in the art. In a specific embodiment, the collector 18 and base contact 21 may each comprise a selectively implanted collector (SIC) formed by implanting an n-type dopant with selected dose and kinetic energy into the central part of the device regions 16, 17 and may be formed at any appropriate point in the process flow. In a specific embodiment, the subcollector 20 and the subbase region 23 may be formed by a high-current ion implantation followed by lengthy, high temperature thermal anneal process that dopes a thickness of the substrate 10 before the optional epitaxial layer is formed. During process steps subsequent to implantation, the dopant in the collector 18 may diffuse laterally and vertically such that substantially the entire central portion of device region 16 becomes doped and is structurally and electrically continuous with the subcollector 20. Similarly, the dopant in the base contact 21 may also exhibit transport from diffusion similar to the dopant diffusion experienced by the collector 18 to become structurally and electrically continuous with the subbase region 23.

The base contact 21 and subbase region 23 are optional features of the PNP bipolar junction transistor 86. In an alternative embodiment, the base contact 21 and subbase region 23 may be omitted from the construction of the PNP bipolar junction transistor 86 so that the PNP bipolar junction transistor 86 includes only a single base contact, rather than dual base contacts.

An intrinsic base layer 22, which is comprised of a material suitable for forming an intrinsic base of the NPN bipolar junction transistor 84, is deposited as a continuous additive layer on the top surface 25 of substrate 10 and, in particular on the top surface 25 of the device region 16. In the representative embodiment, the intrinsic base layer 22 directly contacts the top surface 25 of the device region 16 and a top surface of the trench isolation regions 12, 13. The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded or stepped across the thickness of intrinsic base layer 22. Alternatively, the intrinsic base layer 22 may be comprised of a different semiconductor material, such as silicon (Si). The intrinsic base layer 22 may be doped with one or more impurity species, such as boron and/or carbon.

Intrinsic base layer 22 may be formed using a low temperature epitaxial (LTE) growth process (typically at a growth temperature ranging from 400° C. to 850° C.). The epitaxial growth process is performed after the trench isolation regions 12, 13 are formed. The epitaxial growth process may be non-selective as single crystal semiconductor material (e.g., monocrystalline silicon or SiGe) is deposited epitaxially onto any exposed crystalline surface such as the exposed top surface 25 of device regions 16, and non-monocrystalline semiconductor material (e.g., polysilicon or polycrystalline SiGe) is deposited non-epitaxially onto the non-crystalline material of the trench isolation regions 12 or regions (not shown) where polycrystalline semiconductor material already exists.

The non-selectivity of the growth process causes the intrinsic base layer 22 to incorporate topography. Specifically, the intrinsic base layer 22 includes a raised region 24 above the device region 16, a non-raised region 26 surrounding the raised region 24, and a facet region 28 between the raised region 24 and the non-raised region 26. The raised region 24 of the intrinsic base layer 22 is comprised of monocrystalline semiconductor material and is laterally positioned in vertical alignment with the collector region 18. A top surface of the raised region 24 is elevated relative to a plane containing the top surface 25 of the device region 16. The raised region 24 is circumscribed by the shallow trench isolation regions 12.

The non-raised region 26 of the intrinsic base layer 22 is comprised of polycrystalline semiconductor material and overlies the trench isolation regions 12 near the raised region 24. In the absence of epitaxial seeding over the trench isolation regions 12, the non-raised region 26 forms with a low growth rate outside of the device region 16. The facet region 28 of the intrinsic base layer 22 may be comprised of monocrystalline material transitioning to polycrystalline material. The thickness of the intrinsic base layer 22 may range from about 10 nm to about 600 nm with the largest layer thickness in the raised region 24 and the layer thickness of the non-raised region 26 less than the layer thickness of the raised region 24. The layer thicknesses herein are evaluated in a direction normal to the top surface 25 of substrate 10.

The intrinsic base layer 22 also forms on device region 17 and may be separated from the top surface 23 by one or more intervening layers (not shown). For example, the top surface 25 of device region 17 may be optionally covered by a gate stack structure comprising a thin layer of silicon dioxide (SiO$_2$) and an overlying polysilicon layer. The intrinsic base layer 22 and any other layers are removed from the top surface 25 of the device region 17 so that device region 17 is free of a layer of the semiconductor material constituting the intrinsic base layer 22. In particular, the intrinsic base layer 22 on device region 16 is masked and the semiconductor material of the intrinsic base layer 22 is removed from device region 17 using photolithography and an etching process. To that end, a patterned mask layer (not shown) is applied with an opening that exposes the semiconductor material of the intrinsic base layer 22 located on the device region 17. In one embodiment, the mask layer may be a photoresist layer comprised of a sacrificial organic material applied by spin coating and pre-baking. The photolithography process entails exposing the photoresist layer to radiation imaged through a photomask, baking, and developing the resultant latent feature pattern in the exposed resist to define the opening exposing the semiconductor material of the intrinsic base layer 22 located on the device region 17. An etching process, such as a reactive-ion etching (RIE) process is used to remove the semiconductor material of the intrinsic base layer 22 from the device region 17. This exposes the top surface 25 of the device region 17.

A base dielectric layer 32 is formed on a top surface 30 of intrinsic base layer 22 and, in the representative embodiment, directly contacts the top surface 30. The base dielectric layer 32 reproduces the topography of the underlying intrinsic base layer 22 in device region 16. The base dielectric layer 32 is also formed on the top surface 25 of the device region 17. The base dielectric layer 32 may be an insulating material with a dielectric constant (e.g., a permittivity) characteristic of a dielectric. In one embodiment, the base dielectric layer 32 may be a high temperature oxide (HTO) deposited using rapid thermal process (RTP) at temperatures of 500° C. or higher, and may be comprised of an oxide of silicon, such as $SiO_2$ having a nominal dielectric constant of 3.9. Alternatively, if the base dielectric layer 32 is comprised of oxide, base dielectric layer 32 may be formed by a different deposition process, or by thermal oxidation of silicon (e.g., oxidation at high pressure with steam (HIPDX)), or by a combination of oxide formation techniques known to those of ordinary skill in the art.

A sacrificial layer stack 31 including sacrificial layers 36, 40 is then formed. Sacrificial layer 36 is deposited on a top surface 34 of base dielectric layer 32 and directly contacts the top surface 34. Sacrificial layer 40, which is optional, is deposited on a top surface 38 of sacrificial layer 36. The sacrificial layers 36, 40 reproduce the topography of the underlying intrinsic base layer 22 in device region 16. The sacrificial layer stack 31 is also formed on the top surface 25 of the device region 17 and is separated from the top surface 25 by the base dielectric layer 32.

Sacrificial layer 36 may be comprised of a material with a different etching selectivity than the material of the underlying base dielectric layer 32. In one embodiment, sacrificial layer 36 may be comprised of polycrystalline silicon (e.g., polysilicon) deposited by a conventional deposition process such as low pressure chemical vapor phase deposition (LPCVD) using either silane or disilane as a silicon source or physical vapor deposition (PVD). Sacrificial layer 40 may be comprised of a dielectric material with a different etching selectivity than the material of the underlying sacrificial layer 36. In one embodiment, sacrificial layer 40 may be comprised of $SiO_2$ deposited by CVD or another suitable deposition process.

Figure 2A:
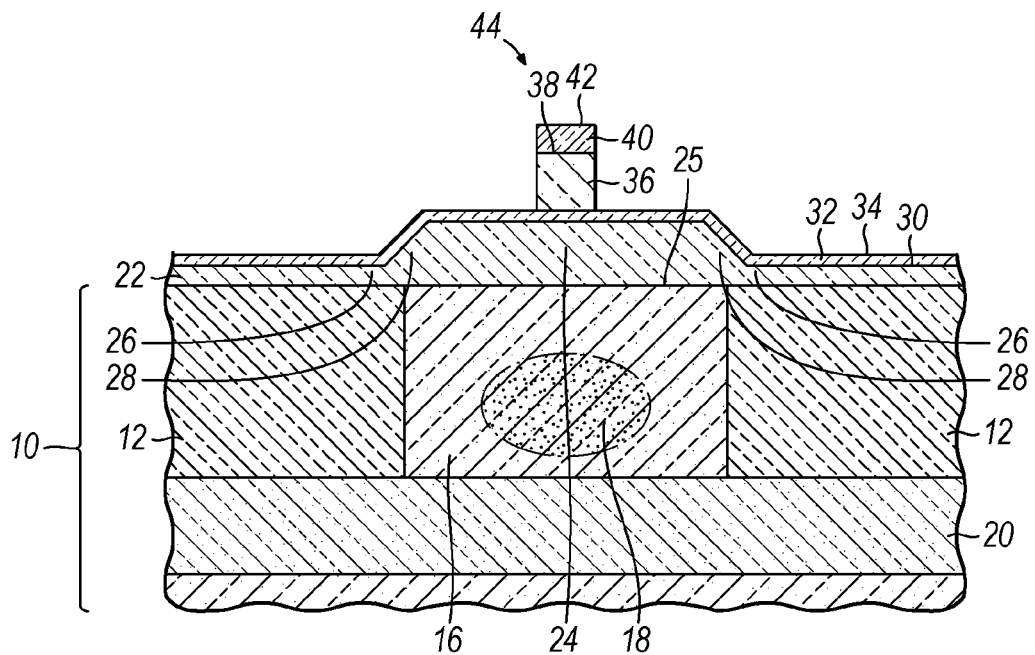
Figure 2B:
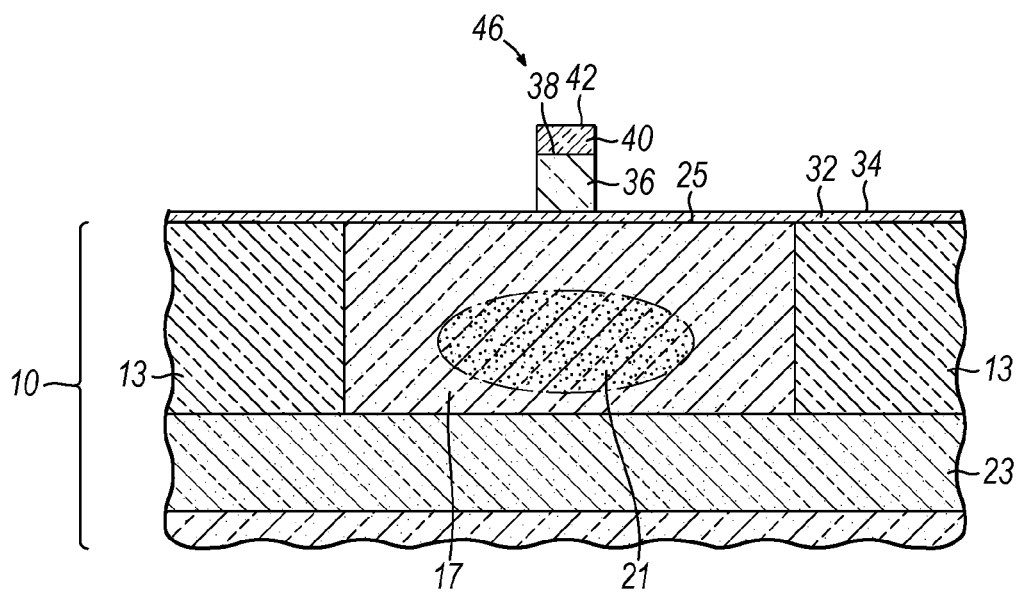

With reference to FIGS. 2A, 2B in which like reference numerals refer to like features in FIGS. 1A, 1B and at a subsequent fabrication stage, the sacrificial layers 36, 40 of the sacrificial layer stack 31 are patterned using photolithography and etching processes to define sacrificial mandrels in the form of a sacrificial emitter pedestal 44 and a sacrificial base pedestal 46. To that end, the sacrificial layer stack 31 is masked with a patterned mask layer (not shown). In one embodiment, the mask layer may be a photoresist layer comprised of a sacrificial organic material applied to the top surface 42 of sacrificial layer 40 by spin coating and pre-baked. The photolithography process entails exposing the photoresist layer to radiation imaged through a photomask, baking, and developing the resultant latent feature pattern in the exposed resist to define residual areas of photoresist that mask portions of sacrificial layer stack 31. In particular, the mask includes resist strips covering respective surface areas on a top surface 42 of sacrificial layer 40 at the intended locations of the sacrificial emitter pedestal 44 and sacrificial base pedestal 46.

An etching process, such as a reactive-ion etching (RIE) process, is used to remove regions of sacrificial layers 36, 40 not protected by the mask layer. For example, an initial segment of the etching process may remove unprotected regions of sacrificial layer 40 and stop on the material of sacrificial layer 36. The etch chemistry may be changed to remove unprotected regions of the underlying sacrificial layer 36 and stop on the material of base dielectric layer 32. Alternatively, a simpler etch chemistry might be used that includes fewer etch steps. At the conclusion of the etching process, the top surface 34 of base dielectric layer 32 is exposed aside from the portions of the top surface 34 covered by the sacrificial emitter pedestal 44 and sacrificial base pedestal 46.

Figure 3A:
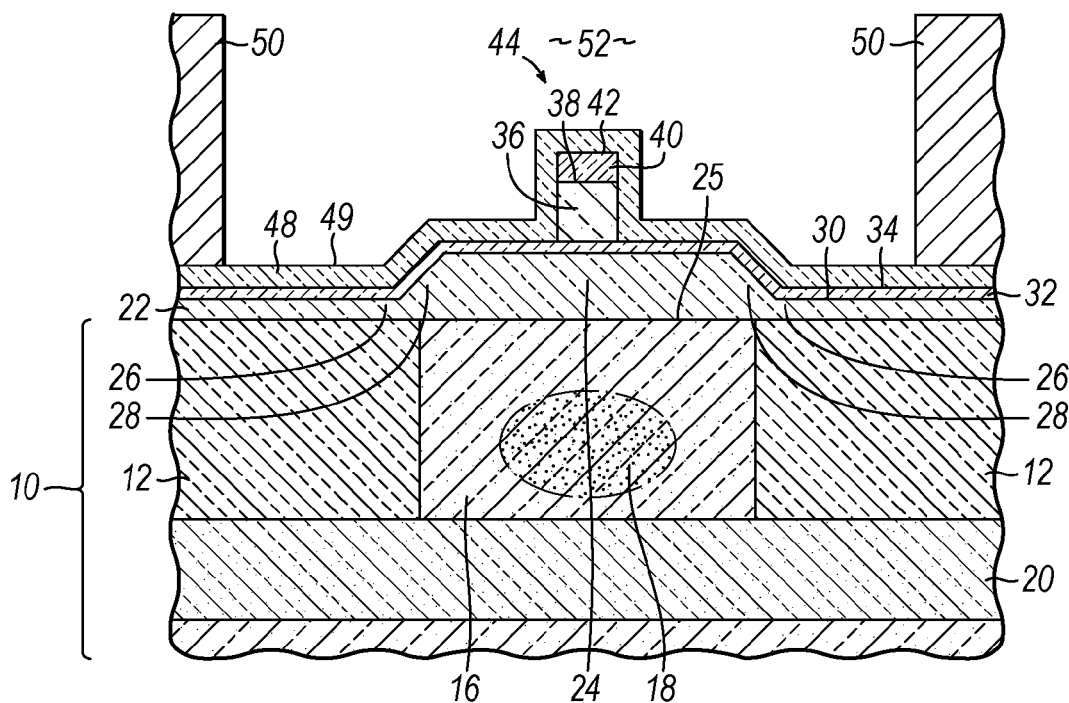
Figure 3B:
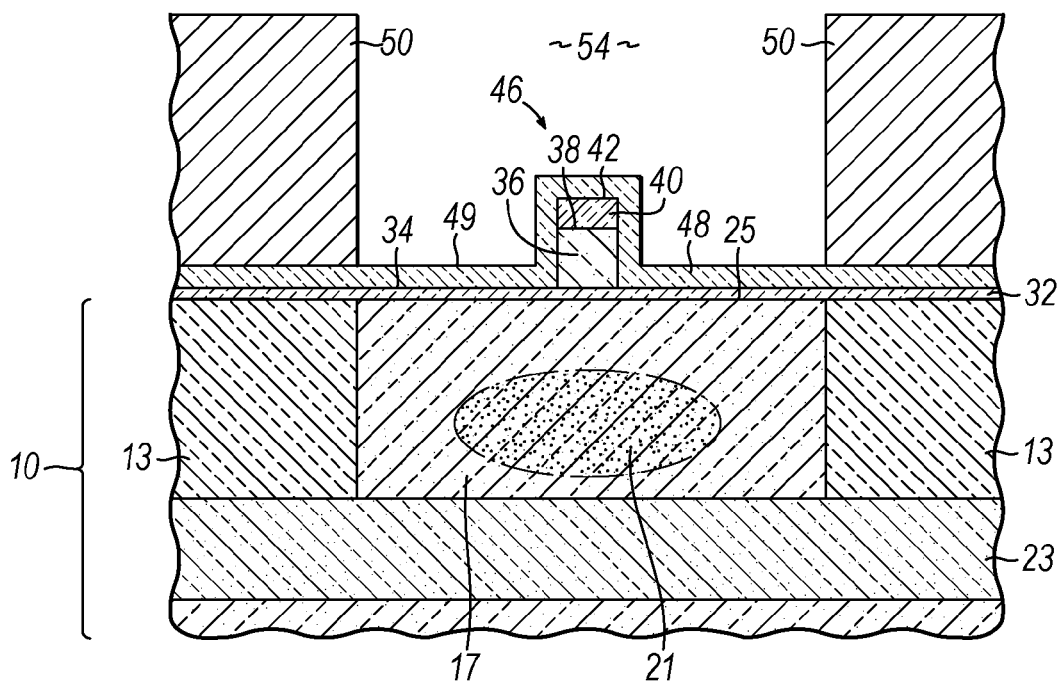

With reference to FIGS. 3A, 3B in which like reference numerals refer to like features in FIGS. 2A, 2B and at a subsequent fabrication stage, a hardmask layer 48 is deposited on a top surface 34 of base dielectric layer 32 and directly contacts the top surface 34. The hardmask layer 48 may be a conformal blanket layer with a thickness that is independent of the topography of underlying features, such as the sacrificial emitter pedestal 44 and sacrificial base pedestal 46. Hardmask layer 48 may be comprised of a dielectric material with a different etching selectivity than the underlying base dielectric layer 32. In one embodiment, hardmask layer 48 may be comprised of silicon nitride ($Si_3N_4$) deposited using CVD. Alternatively, the material of hardmask layer 48 may be deposited by another suitable deposition process.

After hardmask layer 48 is deposited, a resist layer 50 comprised of a radiation-sensitive organic material is applied to a top surface 49 of hardmask layer 48 by spin coating, pre-baked, exposed to radiation to impart a latent image of a pattern including windows 52, 54 to expose surface areas spatially registered with the device regions 16, 17 for bipolar junction transistors 84, 86, baked, and then developed with a chemical developer. Windows 52, 54 are defined as respective openings in the resist layer 50.

Figure 4A:
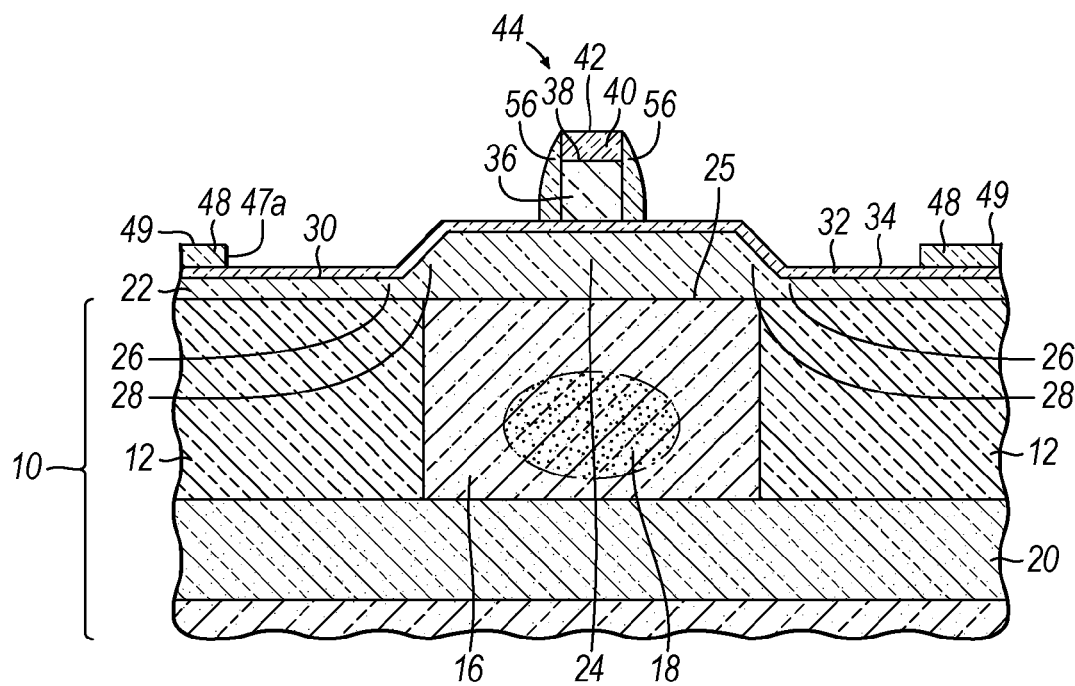
Figure 4B:
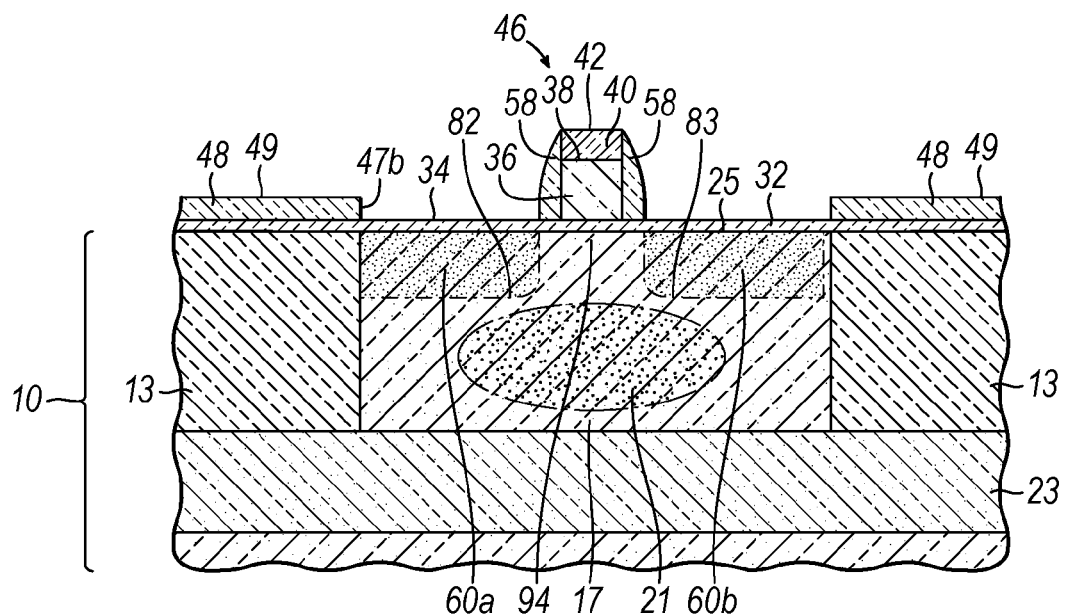

With reference to FIGS. 4A, 4B in which like reference numerals refer to like features in FIGS. 3A, 3B and at a subsequent fabrication stage, an etching process, such as a directional anisotropic etching process like RIE that preferentially removes dielectric material from horizontal surfaces, may be used to remove portions of the hardmask layer 48 in regions unmasked by the resist layer 50 (FIGS. 3A, 3B). The etching process also etches the hardmask layer 48 to form non-conductive spacers 56 on the sidewalls of the sacrificial emitter pedestal 44 and non-conductive spacers 58 on the sidewalls of the sacrificial gate pedestal 46. The non-conductive spacers 56, 58 surround the sidewalls of the sacrificial emitter pedestal 44 and sacrificial gate pedestal 46. In one embodiment, the etching process is selected with an etch chemistry that selectively removes $Si_3N_4$ in hardmask layer 48 relative to $SiO_2$ in the base dielectric layer 32. Following the etching process, the resist layer 50 is removed by oxygen plasma ashing and/or wet chemical stripping.

An opening surrounded an interior edge 47a is defined by the etching process in the hardmask layer 48 at the location of window 52 (FIG. 3A) and extends through the hardmask layer 48 to the top surface 34 of base dielectric layer 32. An opening surrounded by interior edges 47b is defined by the etching process in the hardmask layer 48 at the location of window 54 (FIG. 3B) and extends through the hardmask layer 48 to the top surface 34 of base dielectric layer 32.

Conductive regions 60a, 60b may be formed in the semiconductor material of device region 17 by masking, implanting a suitable impurity species with one or more suitable kinetic energies, and electrically activating the implanted impurity species with a thermal anneal. The implantation may be an implantation used in a conventional CMOS process. The semiconductor material of conductive regions 60a, 60b may be highly doped and may have an opposite conductivity type to the semiconductor material of base contact 21. For example, the conductive regions 60a, 60b may be formed by implanting an impurity species such as boron (B), aluminum (Al), gallium (Ga), or any other suitable p-type dopant if the base contact 21 is n-type semiconductor material. The sacrificial base pedestal 46 may function as a self-aligning block mask for device region 17 and a resist mask (not shown) may be applied to device region 16 during the implantation. In an alternative embodiment, the conductive regions 60a, 60b may be omitted from the device construction.

Figure 5A:
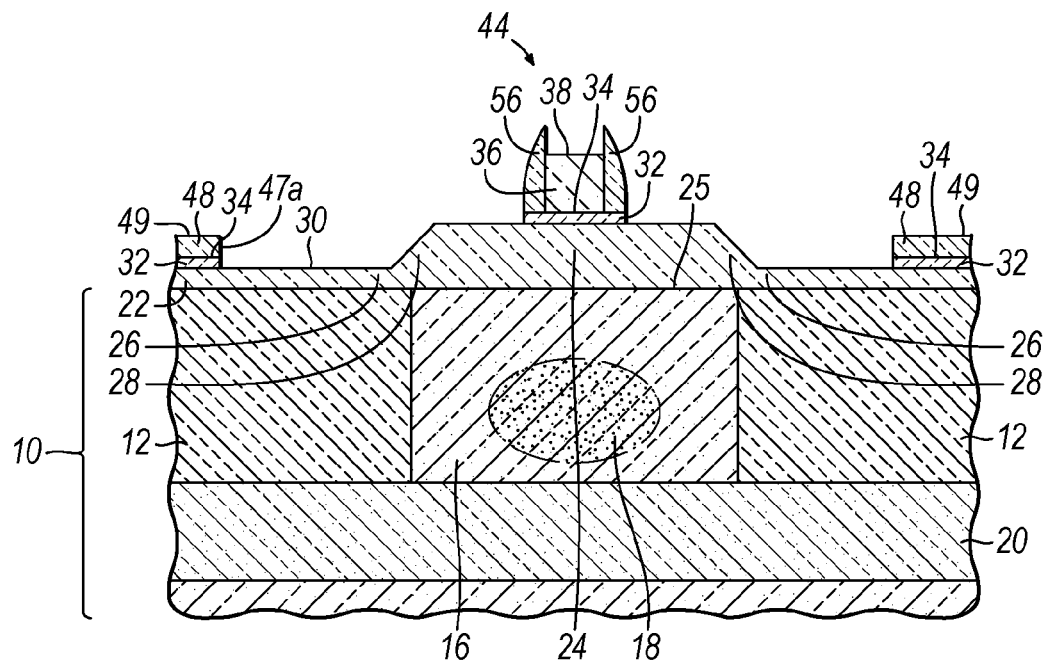
Figure 5B:
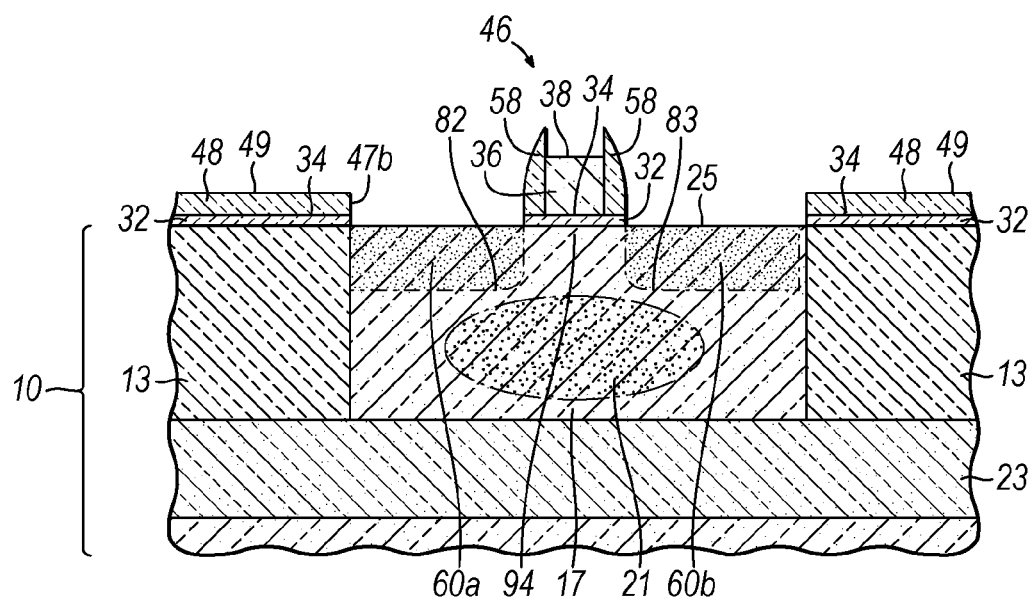

With reference to FIGS. 5A, 5B in which like reference numerals refer to like features in FIGS. 4A, 4B and at a subsequent fabrication stage, the material of base dielectric layer 32 is removed by an etching process that stops on the material constituting intrinsic base layer 22. At the conclusion of the etching process, the top surface 30 of intrinsic base layer 22 is exposed in device region 16 and the top surface 25 of the device region 17 is exposed in device region 17. During the etching process, the patterned hardmask layer 48 operates as a hardmask to selectively mask portions of base dielectric layer 32 outside of the device regions 16, 17. The sacrificial emitter pedestal 44, sacrificial base pedestal 46, and non-conductive spacers 56, 58 also respectively mask surface areas of the base dielectric layer 32 during the etching process.

At the conclusion of the etching process, a portion of the top surface 30 of intrinsic base layer 22 is exposed in device region 16 between the interior edge 47a of the opening in the hardmask layer 48 and the non-conductive spacers 56 on the sacrificial emitter pedestal 44. This portion of the top surface 30 is an intended location for the extrinsic base layer 64 of the NPN bipolar junction transistor 84 (FIG. 8A). Portions of the top surface 30 of intrinsic base layer 22 are exposed in device region 17 between the interior edges 47b of the openings in the hardmask layer 48 and the non-conductive spacers 58 on the sacrificial gate pedestal 46. These distinct portions of the top surface 30 are positioned at intended locations for the emitter 73 and collector 75 of the PNP bipolar junction transistor 86 (FIGS. 8B, 9).

In one embodiment, the etching process may be chemical oxide removal (COR) that removes the material of base dielectric layer 32, if comprised of $SiO_2$, with minimal undercut beneath the non-conductive spacers 56, 58. A COR process utilizes a vapor or, more preferably, a mixture flow of hydrogen fluoride (HF) and ammonia ($NH_3$) in a ratio of 1:10 to 10:1 and may be performed at low pressures (e.g., of about 1 mTorr to about 100 mTorr) and room temperature. The COR process may be performed in situ in the deposition chamber or may be performed in an independent chamber. Sacrificial layer 40 is also removed, or optionally only partially removed, from the sacrificial layer stack 31 by the etching process. An optional hydrofluoric acid chemical cleaning procedure may follow the COR process.

Figure 6A:
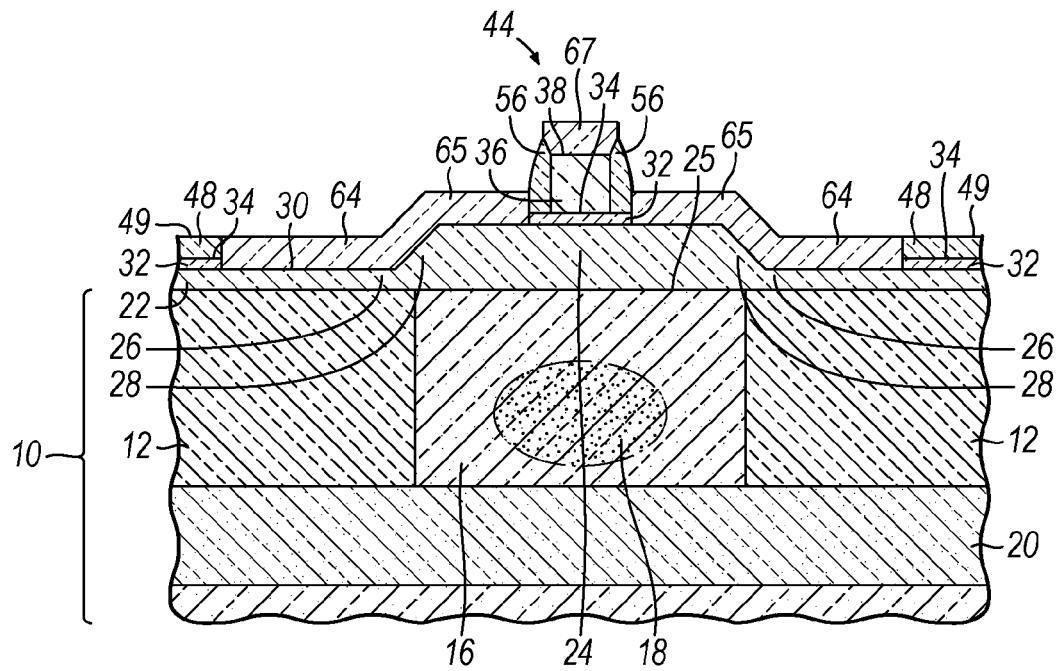
Figure 6B:
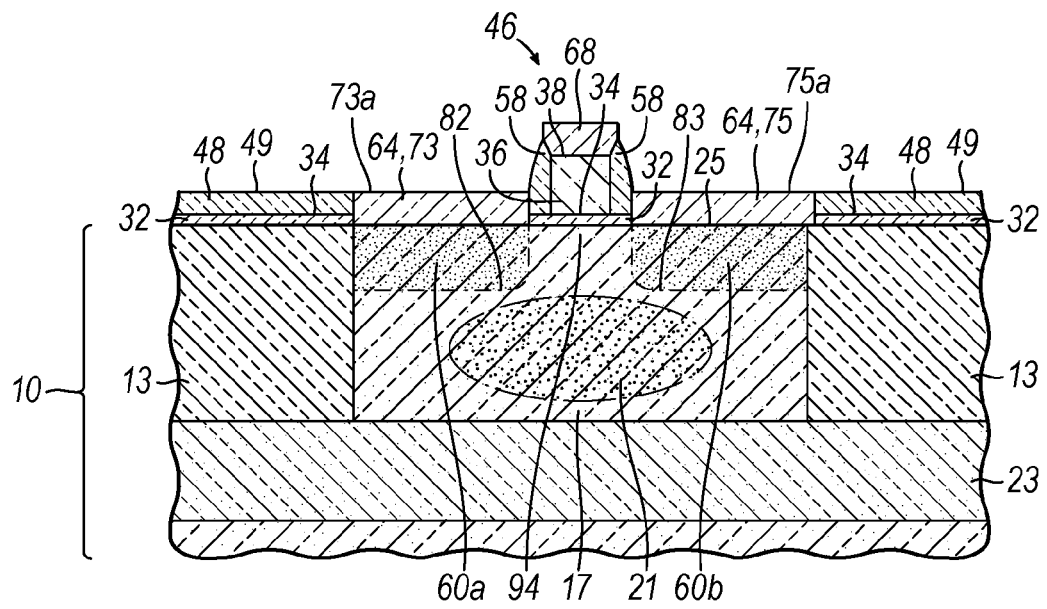

With reference to FIGS. 6A, 6B in which like reference numerals refer to like features in FIGS. 5A, 5B and at a subsequent fabrication stage, an extrinsic base layer 64 is formed in device region 16 on the portion of the top surface 30 of intrinsic base layer 22 and in device region 17 on the portions of the top surface 25 in the device region 17 that are not covered by the patterned hardmask layer 48. In the representative embodiment, the extrinsic base layer 64 directly contacts the top surface 25 in device region 17 and the top surface 30 in device region 16. Respective caps 67, 68 comprised of the material of the extrinsic base layer 64 are formed on top of the sacrificial layer 36 between non-conductive spacers 56 and non-conductive spacers 58. The material of the extrinsic base layer 64 does not form on hardmask layer 48 or on the non-conductive spacers 56, 58.

In one embodiment, the extrinsic base layer 64 may be comprised of a semiconductor material (e.g., silicon or SiGe) formed by a selective epitaxial growth (SEG) deposition process. If comprised of SiGe, the concentration of Ge may have a graded or an abrupt profile if the extrinsic base layer 64 is comprised of SiGe, and may include additional layers, such as a Si cap. Epitaxial growth is a process by which a layer of single-crystal material, i.e., the extrinsic base layer 64, is deposited on a single-crystal substrate (i.e., the intrinsic base layer 22 and the device region 17) and in which the crystallographic structure of the single-crystal substrate is reproduced in the layer 64. If the chemical composition of the extrinsic base layer 64 differs from the chemical composition of the intrinsic base layer 22, then a lattice constant mismatch may be present between the epitaxial material of the extrinsic base layer 64 and the intrinsic base layer 22 and/or the device region 17.

In an SEG deposition process, nucleation of the constituent semiconductor material of the extrinsic base layer 64 is suppressed on insulators, such as on the top surface 49 of the hardmask layer 48 and on the non-conductive spacers 56, 58. The selectivity of the SEG deposition process forming the extrinsic base layer 64 may be provided by an etchant, such as hydrogen chloride (HCl), in the reactant stream supplied to the SEG reaction chamber or by the germanium source, such as germane ($GeH_4$) or digermane ($Ge_2H_6$), supplied to the SEG reaction chamber. If the extrinsic base layer 64 does not contain germanium, then a separate etchant may be supplied to the SEG reaction chamber to provide the requisite selectivity. If the extrinsic base layer 64 contains germanium formed using a germanium source gas, the provision of an additional etchant to the SEG reaction chamber is optional.

The extrinsic base layer 64 may be in situ doped during deposition with a concentration of a dopant, such as an impurity species from Group III of the Periodic Table (e.g., boron or indium) effective to impart a p-type conductivity in which holes are the majority carriers and dominate the electrical conductivity of the host semiconductor material. The extrinsic base layer 64 may comprise heavily-doped p-type semiconductor material.

In device region 16, the material in the extrinsic base layer 64 is ultimately used to form an extrinsic base of a NPN bipolar junction transistor 84 (FIG. 8A). The uneven topography of the underlying intrinsic base layer 22 is at least partially reproduced in the extrinsic base layer 64 on device region 16 so that the extrinsic base layer 64 has a raised region 65 that overlies the raised region 24 of the intrinsic base layer 22.

In device region 17, an emitter 73 and a collector 75 of the PNP bipolar junction transistor 86 (FIGS. 8B, 9) are comprised of respective strips of the material of extrinsic base layer 64. The emitter 73 and collector 75 are positioned on opposite sides of the sacrificial base pedestal 46 in a lateral device construction and have respective top surfaces 73a, 75a that are raised relative to the top surface 25 of the device region 17. The emitter 73 and collector 75 are laterally spaced apart by the width of the sacrificial base pedestal 46 and intervening spacers 58. When the device region 17 is opened by the selective etching of the hardmask layer 48, the dimensions of the interior edges 47b surrounding the openings in the hardmask layer 48 are controlled so that the sacrificial base pedestal 46 and non-conductive spacers 58 overlap the trench isolations regions 13. The overlap cooperates with the non-conductive spacers 58 to electrically isolate the emitter 73 and collector 75 from each other and eventually from the base contact 80 formed between the non-conductive spacers 58.

The emitter 73 and the conductive region 60a share a boundary that defines a p-n junction 82 of the lateral PNP bipolar junction transistor 86. Similarly, the collector 75 and the conductive region 60b share a boundary that defines another p-n junction 83 of the lateral PNP bipolar junction transistor 86. The base 94 of the lateral PNP bipolar junction transistor 86 is laterally positioned in the device region 17 between the p-n junctions 82, 83. If the conductive regions 60a, 60b are absent from the device construction, then the p-n junction 82 will be located across the surface area of direct contact between the emitter 73 and the top surface 25 of the device region 17 (which has an n-type conductivity) and the p-n junction 83 will be located across the surface area of direct contact between the collector 75 and the top surface 25 of the device region 17.

Figure 7A:
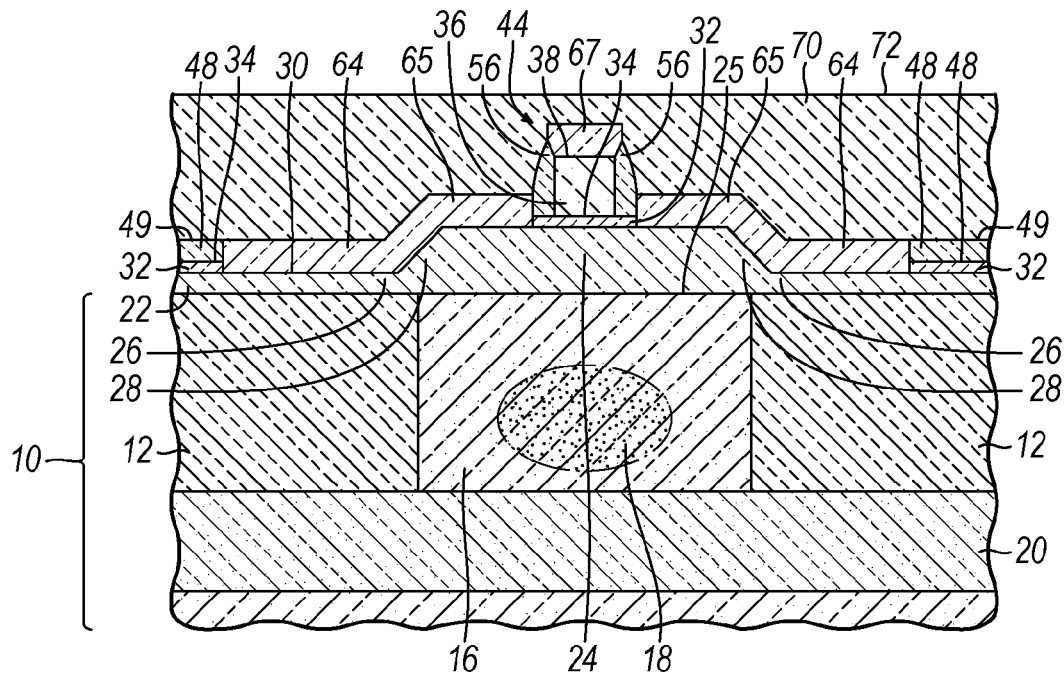
Figure 7B:
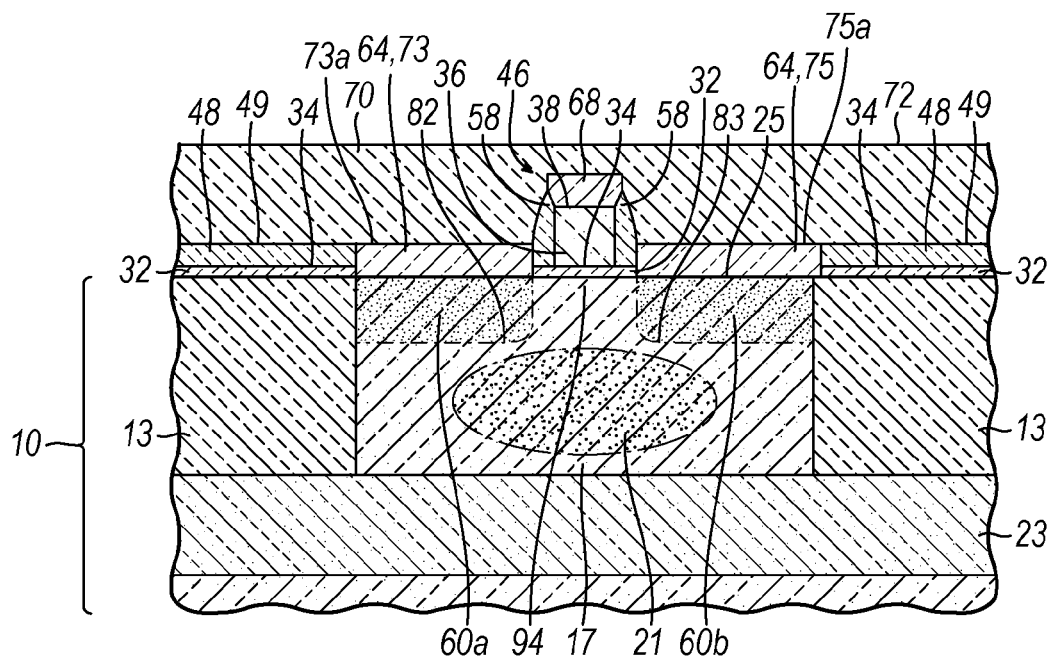

With reference to FIGS. 7A, 7B in which like reference numerals refer to like features in FIGS. 6A, 6B and at a subsequent fabrication stage, an insulating layer 70 is deposited that buries the sacrificial emitter pedestal 44 and sacrificial base pedestal 46. The insulating layer 70 may be comprised of a dielectric, which is an insulating material having a dielectric constant (e.g., permittivity) characteristic of a dielectric material. In one embodiment, insulating layer 70 may be comprised of $SiO_2$ formed by plasma-enhanced CVD (PECVD) or another suitable deposition process. A top surface 72 of the insulating layer 70 is planarized using a chemical-mechanical polishing (CMP) process so that the top surface 72 is flat. The CMP process combines abrasion and dissolution to remove a thickness of the insulating layer 70 so that the non-planar topography of the top surface 72 from the presence of the sacrificial emitter pedestal 44 and sacrificial base pedestal 46 is reduced or eliminated, and the top surface 72 is thereby flattened. The CMP process is controlled such that the sacrificial emitter pedestal 44 and sacrificial base pedestal 46 remain buried beneath the top surface 72 of the insulating layer 70.

With reference to FIGS. 8A, 8B, and 9 in which like reference numerals refer to like features in FIGS. 7A, 7B and at a subsequent fabrication stage, the top surface 72 of insulating layer 70 is further recessed relative to the sacrificial emitter pedestal 44 and sacrificial base pedestal 46 by an etching process, such as RIE. An emitter window 74 is formed between the non-conductive spacers 56 and a base window 76 is formed between the non-conductive spacers 58. The emitter window 74 extends to the depth of the top surface 30 of intrinsic base layer 22. The base window 76 extends to the depth of the top surface 25 of the device region 17.

To that end, sacrificial layer 40, which is exposed by the recession of insulating layer 70, is then removed from its position between the non-conductive spacers 56 and between the non-conductive spacers 58. Sacrificial layer 40 may be removed from the sacrificial emitter pedestal 44 and sacrificial base pedestal 46 using a suitable wet chemical etch or RIE with a suitable etch chemistry.

Sacrificial layer 36, which is exposed after the removal of sacrificial layer 40, is removed from its position between the non-conductive spacers 56 on the sacrificial emitter pedestal 44 and between the non-conductive spacers 58 on the sacrificial base pedestal 46. Sacrificial layer 36 may be etched using dry etching process that removes the material of sacrificial layer 36 selective to the materials of base dielectric layer 32, non-conductive spacers 56, 58, and base dielectric layer 32. The etching process stops upon reaching the top surface 34 of the base dielectric layer 32. An etching process such as a hydrofluoric acid type procedure like a dilute hydrofluoric (DHF) or a buffered hydrofluoric (BHF) wet procedure, or a COR process is then applied to remove portions of the base dielectric layer 32 not covered by the non-conductive spacers 56, 58.

An emitter 78 of the NPN bipolar junction transistor 84 is formed in the emitter window 74 and a base contact 80 of the PNP bipolar junction transistor 86 is formed in the base window 76. The emitter 78 has a bottom surface that directly contacts the top surface 30 of the raised base region 24 of intrinsic base layer 22. The emitter 78 is T-shaped and includes a head that protrudes out of the emitter window 74 and above the top surface 72 of insulating layer 70. The base contact 80 has a bottom surface that directly contacts the top surface 25 of the device region 17 at a location laterally between the emitter 73 and collector 75.

The emitter 78 of the NPN bipolar junction transistor 84 and the base contact 80 of the PNP bipolar junction transistor 86 may be formed by depositing a layer comprised of a heavily-doped semiconductor material and then patterning the deposited layer using lithography and etching processes. For example, the emitter 78 and the base contact 80 may be formed from polysilicon deposited by CVD or rapid thermal CVD (RTCVD) and heavily doped with a concentration of a dopant, such as an impurities species from Group V of the Periodic Table (e.g., arsenic) to impart an n-type conductivity. The heavy-doping level modifies the resistivity of the polysilicon and may be implemented by in situ doping that adds a dopant gas to the CVD reactant gases during the deposition process.

The lithography process forming the emitter 78 and the base contact 80 from the layer of heavily-doped semiconductor material may utilize photoresist and photolithography to form an etch mask that protects only strips of the heavily-doped semiconductor material registered with the emitter window 74 and the base window 76. An etching process that stops on the material of insulating layer 70 is selected to shape the emitter 78 and the base contact 80 from the protected strips of heavily-doped semiconductor material. The mask is subsequently stripped, which exposes the top surface 72 of insulating layer 70 surrounding the emitter 78 and the base contact 80.

The insulating layer 70, the extrinsic base layer 64, and the intrinsic base layer 22 may be patterned using conventional photolithography and etching processes to define an extrinsic base and an intrinsic base of the NPN bipolar junction transistor 84. The extrinsic base layer 64 is separated from the emitter 78 by the non-conductive spacers 56. Sections of insulating layer 70 may be retained between the extrinsic base layer 64 and the emitter 78. The PNP bipolar junction transistor 86 is also trimmed by similar patterning.

The emitter 78, intrinsic base layer 22, and collector 18 of the NPN bipolar junction transistor 84 are vertically arranged. The intrinsic base layer 22 is located vertically between the emitter 78 and the collector 18. One p-n junction is defined at the interface between the emitter 78 and the intrinsic base layer 22. Another p-n junction is defined at the interface between the collector 18 and the intrinsic base layer 22.

The PNP bipolar junction transistor 86 has a lateral architecture. One p-n junction is defined at the interface between the emitter 73 and base 94. Another p-n junction is defined at the interface between the collector 75 and the base 94.

Fabrication of the PNP bipolar junction transistor 86 requires only one additional mask that is shared with other devices. The one additional mask is used to open an area on the top surface 25 of the device region 17 following the deposition of the intrinsic base layer 22. The sacrificial base pedestal 46 is fabricated on the top surface 25 within the opened area, while concurrently fabricating the sacrificial emitter pedestal 44 on the open area of the top surface 25 of the raised region 24 of intrinsic base layer 22. The extrinsic base area for the NPN bipolar junction transistor 84, the emitter and collector area for the PNP bipolar junction transistor 86, the non-conductive spacers 56 on the sidewalls of the sacrificial emitter pedestal 44, and the non-conductive spacers 58 on the sidewalls of the sacrificial base pedestal 46 are formed with the same processes and masks.

The PNP bipolar junction transistor 86 has a relatively narrow base 94 and, for at least that reason, is expected to exhibit improved performance. The base 94 of the PNP bipolar junction transistor 86 comprises n-type semiconductor material of the device region 17 that is located vertically between the base contacts 21, 80 or, if base contact 21 is absent, that is beneath the base contact 80. The doping of the base 94 may originate from the base contact 80 and/or base contact 21 as a result of diffusion from thermal processing. Alternatively, the doping of the base 94 may be provided by ion implantation of an n-type dopant at the fabrication stage shown in FIG. 2B after the device region 17 is opened.

The width of the sacrificial base pedestal 46, as well as the width of the sacrificial emitter pedestal 44, may be defined by a minimum dimension of the patterned sacrificial layer 36 as prescribed by the particular technology node used to fabricate the NPN bipolar junction transistor 84 and the PNP bipolar junction transistor 86. The minimum dimension can be very narrow in width. The base window 76 between the non-conductive spacers 58, which are formed using the sacrificial base pedestal 46, operated to self align the base contact 80 during formation with the emitter 73 and the collector 75 and, furthermore, operate to self-align the optional base contact 21 with the base contact 80.

The emitter 73 and collector 75 of the PNP bipolar junction transistor 86 are formed from selectively grown semiconductor material (e.g., Si or SiGe) of layer 64. The emitter 73 and collector 75 directly contact the top surface 25 of the device region 17 and project or extend above the top surface 25 of the device region 17 upon which the PNP bipolar junction transistor 86 is formed. The emitter 73 may optionally include the optional conductive region 60*a* and collector 75 may optionally include the optional conductive region 60*b*. If the optional conductive regions 60*a*, 60*b* are included in the construction of the PNP bipolar junction transistor 86, then the emitter 73 and the collector 75 extend both above and below the top surface 25 of the device region 17 upon which the PNP bipolar junction transistor 86 is formed.

The vertical NPN bipolar junction transistor 84 is formed using device region 16 concurrently with the formation of the lateral PNP bipolar junction transistor 86 using device region 17. The emitter 78 of the NPN bipolar junction transistor 84 and the base contact 80 of the PNP bipolar junction transistor 86 are concurrently formed using the respective device regions 16, 17 with the same processes and the same masks. The collector 18 of the NPN bipolar junction transistor 84 and the base contact 21 of the PNP bipolar junction transistor 86 are concurrently formed using the respective device regions 16, 17 with the same processes and the same masks. The extrinsic base of the vertical NPN bipolar junction transistor 84, as well as the emitter 73 and the collector 75 of the lateral PNP bipolar junction transistor 86, are concurrently formed by portions of the epitaxially-grown layer 64 formed on the respective device regions 16, 17.

During the front-end-of-line (FEOL) portion of the fabrication process, the device structure of the bipolar junction transistors 84, 86 may be replicated across different portions of the surface area of the substrate 10. In BiCMOS integrated circuits, complementary metal-oxide-semiconductor (CMOS) transistors may be formed using other regions of the substrate 10. As a result, both bipolar and CMOS transistors available on the same substrate 10.

Standard back-end-of-line (BEOL) processing follows, which includes formation of wiring lines and via plugs in dielectric layers to form an interconnect structure coupled with the bipolar junction transistors 84, 86, as well as other similar device structures and optionally CMOS transistors (not shown) included in other circuitry fabricated on the substrate 10. In particular, one or more contacts may be formed that supply an electrical contact with the emitter 73, one or more contacts may be formed that supply an electrical contact with the collector 75, and one or more contacts may be formed that supply an electrical contact with base contact 21. The subbase region 23, which is comprised of n-type semiconductor material, is coupled with the base contact 21 and extends laterally of the device region 17 and beneath the trench isolation regions 13 to couple the base contact 21 with the one or more contacts. Other active and passive circuit elements, such as diodes, resistors, capacitors, varactors, and inductors, may be fabricated on substrate 10 and available for use in the BiCMOS integrated circuit.

In the representative embodiment, the PNP bipolar junction transistor 86 includes dual base contacts, specifically the base contact 21 and the base contact 80. The base 94 of the PNP bipolar junction transistor 86 is disposed between the base contacts 21, 80 and is laterally positions to be in vertical alignment with each of the base contacts 21, 80. One or both of the base contacts 21, 80 may be used to control current flow through the base 94 between the emitter 73 and the collector 75. In an alternative embodiment, the base contact 21 may be omitted from the construction of the PNP bipolar junction transistor 86. In yet another alternative embodiment, the base contact 21 may be non-contacted and floating, or may be biased with a constant potential to elevate the potential of the base contact 80 and thereby modify the device threshold voltage of the PNP bipolar junction transistor 86.

Figure 10:
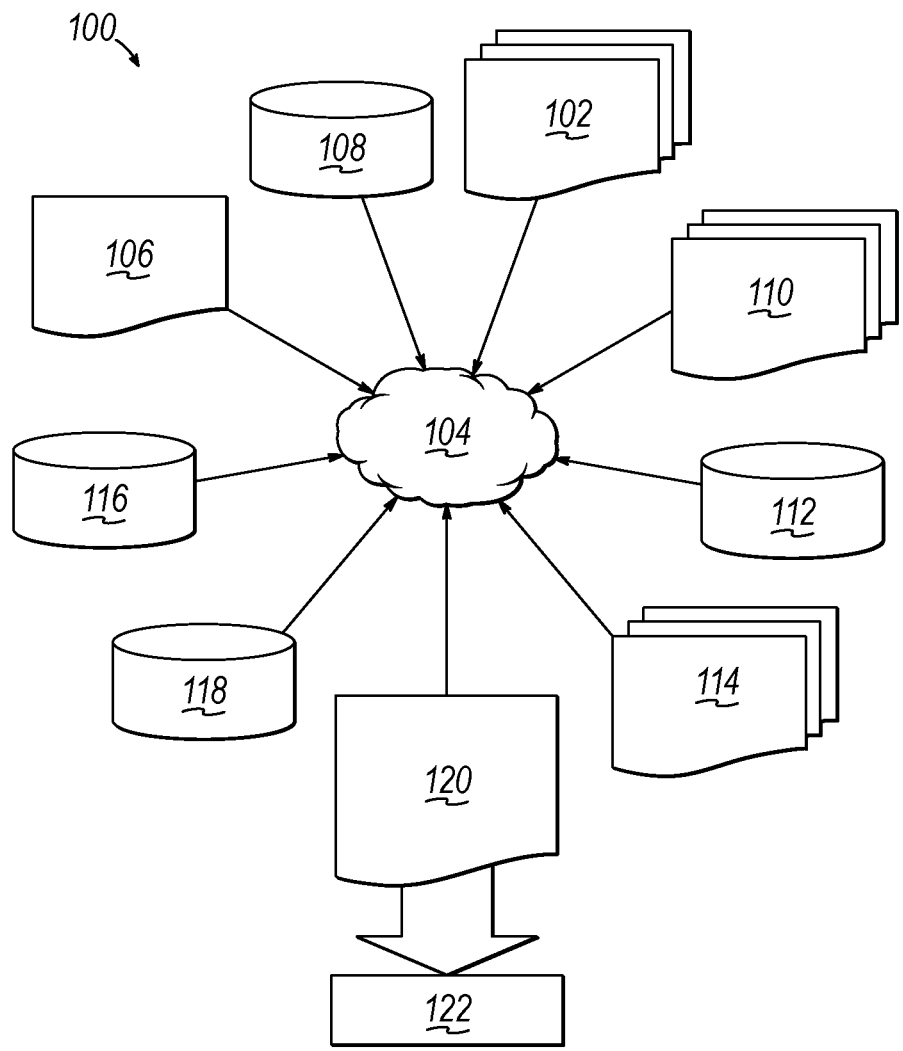
FIG. 10 is a flow diagram of a design process used in semiconductor design, manufacture, and/or test.

FIG. 10 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 8A, 8B, and 9. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 8A, 8B, and 9. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 8A, 8B, and 9 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 84 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 8A, 8B, and 9. In one embodiment, design structure 120 may comprise a compiled, executable HDL simulation model that functionally simulates the devices shown in FIGS. 8A, 8B, and 9.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 8A, 8B, and 9. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when an element is described as being "connected" or "coupled" to or with another element, it can be directly connected or coupled with the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A lateral PNP bipolar junction transistor formed using a device region having a top surface, the lateral PNP bipolar junction transistor comprising:
   a base comprised of n-type semiconductor material;
   a first base contact positioned at a location on the top surface of the device region that is in vertical alignment with the base;
   a second base contact in the device region, the second base contact aligned vertically with the first base contact, and the second base contact comprised of an n-type semiconductor material;
   an emitter comprised of p-type semiconductor material having the epitaxial relationship with the device region; and
   a collector comprised of the p-type semiconductor material having the epitaxial relationship with the device region,
   wherein the emitter and the collector are each in contact with the top surface of the device region, and the first base contact and the base are laterally positioned between the emitter and the collector.

2. The lateral PNP bipolar junction transistor of claim 1 wherein the p-type semiconductor material comprises p-type silicon-germanium or p-type silicon.

3. The lateral PNP bipolar junction transistor of claim 1 further comprising:
   a plurality of spacers flanking the first base contact, the spacers configured to position the emitter and the collector in a self-aligned relationship with the first base contact and the base.

4. The lateral PNP bipolar junction transistor of claim 1 wherein the emitter includes a top surface that projects above the top surface of the device region and the collector includes a top surface that projects above the top surface of the device region.

5. The lateral PNP bipolar junction transistor of claim 4 further comprising:
   a first p-type region within the device region, the first p-type region comprising a portion of the emitter that extends below the top surface of the device region.

6. The lateral PNP bipolar junction transistor of claim 5 further comprising:
   a second p-type region within the device region, the second p-type region comprising a portion of the collector that extends below the top surface of the device region.

7. The lateral PNP bipolar junction transistor of claim 4 further comprising:
   a p-type region within the device region, the p-type region comprising a portion of the collector that extends below the top surface of the device region.

8. The lateral PNP bipolar junction transistor of claim 1 further comprising:
   a first trench isolation region and a second trench isolation region that each extend relative to the top surface into a substrate to define the device region from a portion of the substrate, the first trench isolation region and the second trench isolation region surrounding the device region.

9. The lateral PNP bipolar junction transistor of claim 1 wherein the n-type semiconductor material of the second base contact has a higher dopant concentration than the n-type semiconductor material of the base.

10. The lateral PNP bipolar junction transistor of claim 1 wherein the base is located vertically between the first base contact and the second base contact.

11. The lateral PNP bipolar junction transistor of claim 1 wherein the emitter and the collector are raised relative to the top surface of the device region, and the spacers align the emitter and the collector with the first base contact.

12. The lateral PNP bipolar junction transistor of claim 1 further comprising:
   a first trench isolation region and a second trench isolation region that each extend relative to the top surface into a substrate to define the device region from a portion of the substrate.

13. The lateral PNP bipolar junction transistor of claim 12 wherein the top surface of the device region is located between the first trench isolation region and the second trench isolation region.

14. The lateral PNP bipolar junction transistor of claim 1 wherein the emitter is arranged to directly contact the top surface of the device region, and the collector is arranged to directly contact the top surface of the device region.

15. The lateral PNP bipolar junction transistor of claim 8 further comprising:
   a subbase in the substrate and coupled with the second base contact, the subbase extending laterally beneath the trench isolation regions.

* * * * *

UNITED STATES PATENT AND TRADEMARK OFFICE
CERTIFICATE OF CORRECTION

PATENT NO.        : 9,159,816 B2
APPLICATION NO.   : 14/497579
DATED             : October 13, 2015
INVENTOR(S)       : David L. Harame and Qizhi Liu Page 1 of 1

It is certified that error appears in the above-identified patent and that said Letters Patent is hereby corrected as shown below:

In The Claims

Column 15, line 51, change the first occurrence of "the" to --an--

Signed and Sealed this
Eighth Day of March, 2016

Michelle K. Lee
*Director of the United States Patent and Trademark Office*